(12) United States Patent
Fuin (10) Patent No.: US 7,594,098 B2
(45) Date of Patent: Sep. 22, 2009

(54) PROCESSES AND DEVICES FOR COMPRESSION AND DECOMPRESSION OF EXECUTABLE CODE BY A MICROPROCESSOR WITH RISC ARCHITECTURE AND RELATED SYSTEM

(75) Inventor: Didier Fuin, Lumbin (FR)

(73) Assignee: STMicroelectronics, SA, Montrouge (FR)

(*) Notice: Subject to any disclaimer, the term of this patent is extended or adjusted under 35 U.S.C. 154(b) by 87 days.

(21) Appl. No.: 11/480,781

(22) Filed: Jun. 30, 2006

(65) Prior Publication Data
US 2007/0174588 A1    Jul. 26, 2007

(30) Foreign Application Priority Data
Jun. 30, 2005 (FR) ................... 05 07028
Jun. 30, 2005 (FR) ................... 05 07029

(51) Int. Cl.
*G06F 9/30* (2006.01)
*G06F 9/00* (2006.01)
*G06F 9/45* (2006.01)
*G06F 17/00* (2006.01)

(52) U.S. Cl. ............. 712/220; 712/209; 712/210; 707/101; 717/159

(58) Field of Classification Search ............ 712/220
See application file for complete search history.

(56) References Cited

U.S. PATENT DOCUMENTS

| | | | |
|---|---|---|---|
| 5,337,087 A | 8/1994 | Mishima | |
| 5,363,097 A | 11/1994 | Jan | |
| 5,764,994 A | 6/1998 | Craft | |
| 5,819,058 A * | 10/1998 | Miller et al. | ............ 712/210 |
| 6,199,126 B1 | 3/2001 | Auerbach et al. | |
| 6,618,506 B1 | 9/2003 | Auerbach et al. | |
| 6,977,941 B2 | 12/2005 | Takahashi et al. | |

(Continued)

OTHER PUBLICATIONS

Wolfe A et al., "Executing Compressed Programs On An Embedded RISC Architecture", Microarchitecture, 1992. Micro 25., Proceedings of the 25th Annual International Symposium on Portland, OR, USA 1-4 Cec. 1992, Los Alamitos, CA, USA, IEEE Comput. Soc. US, Dec. 1, 1992, pp. 81-91.

(Continued)

*Primary Examiner*—Eddie P Chan
*Assistant Examiner*—William B Partridge
(74) *Attorney, Agent, or Firm*—Kevin Jablonski; Graybeal Jackson LLP (57) ABSTRACT

An embodiment of the invention relates to a process for compression of executable code by a microprocessor, comprising decomposing the executable code into words; dividing the executable code into instruction lines; compressing each word of each line in the form of a compressed word of variable length, the compressed words of a line being combined into a line of compressed words; and constituting an addressing table localizing each of the lines of compressed words in a block of lines compressed words and comprising one input per group of lines of compressed words, each input (j) specifying the position of a first line of compressed words in the block, and the respective lengths of the lines of compressed words of group, except for a last line of compressed words of the group, whereof the length is determined by means of the position of a first line of compressed words of a following group.

50 Claims, 5 Drawing Sheets

U.S. PATENT DOCUMENTS

| | | |
|---|---|---|
| 7,522,775 B2 | 4/2009 | Boon |
| 2002/0089436 A1* | 7/2002 | Yariv .......................... 341/51 |
| 2002/0199083 A1 | 12/2002 | Kao et al. |
| 2003/0044074 A1 | 3/2003 | Weiss et al. |
| 2003/0118114 A1 | 6/2003 | Penna |
| 2004/0021593 A1 | 2/2004 | Park et al. |
| 2005/0196151 A1 | 9/2005 | Takagi et al. |
| 2007/0194957 A1 | 8/2007 | Watanabe |
| 2008/0126083 A1 | 5/2008 | Moriya et al. |
| 2008/0320157 A1 | 12/2008 | Sather et al. |

OTHER PUBLICATIONS

Lefurgy C et al., "Improving code density using compression techniques", Proceedings of the 30$^{th}$ Annual IEEE/ACM International Symposium on Microarchitecture. Micro-30. Research Triangle Park, NC, Dec. 1-3, 1997, Proceedings of the Annual International Symposium on Microarchitecture, Los Alamitos, CA, IEEE Computer So, vol. 30$^{th}$ Conf, Dec. 1, 1997.

French Search Report for FR 0507029 dated Apr. 4, 2006.

French Search Report for FR 0507028 dated Apr. 3, 2006.

* cited by examiner

PROCESSES AND DEVICES FOR COMPRESSION AND DECOMPRESSION OF EXECUTABLE CODE BY A MICROPROCESSOR WITH RISC ARCHITECTURE AND RELATED SYSTEM

PRIORITY CLAIM

This application claims priority from French patent application Nos. 05 07028 and 05 07029, both filed Jul. 1, 2005, which are incorporated herein by reference.

CROSS REFERENCE TO RELATED APPLICATION

This application is related to U.S. patent application Ser. No. 11/480,769, which has a common filing date and owner and which is incorporated by reference.

TECHNICAL FIELD

The present invention relates to the field of compression of executable code by a microprocessor.

The embodiment may apply particularly, but not exclusively, to code executable by RISC (Reduced Instruction Set Computer) microprocessors, as compared to microprocessors with CISC (Complex Instruction Set Computer) architecture.

BACKGROUND

Relative to microprocessors with CISC architecture, RISC microprocessors have the advantage of possessing simplified architecture, which produces notably higher execution speeds, and employing code compilers notably simpler than CISC microprocessors. In contrast, programs written for microprocessors with RISC architecture are notably more capacious, typically by 20 to 50%. The result is an increase in the loading time for a program in view of its execution, an increase in the memory resources necessary for saving the program, and an increase in the necessary bandwidth if the program must be transmitted over a network within a predetermined period.

By way of a solution to this problem, U.S. Pat. No. 5,764,994 (which is incorporated by reference) proposes applying compression processes such as Lempel-Ziv by such microprocessors to the executable code, based on the detection of repetitions of patterns, the compressed code then being decompressed on the fly at the moment of its execution by the microprocessor. All the same, such a code is difficult to be compressed due to the presence in the instructions of executable RISC code of redundant fields which contain no information, but reduce the efficacy of the data model constructed during compression. In addition, the instructions of executable RISC code have different formats, and utilize numerous registers and literal values, which make detection of repeated patterns in the code difficult.

U.S. Pat. Nos. 6,618,506 and 6,199,126 (which are incorporated by reference) provide decomposing the executable program to be compressed into two subsets respectively comprising the field of operating code and the operating field of each instruction, then conducting statistical analysis of each subset to evaluate frequencies of appearance of symbols. Next, each symbol is attributed a code whereof the size is smaller for those symbols having a high frequency of appearance in the subset, and a correspondence table between the symbols and the codes attributed to the symbols is made. Each code comprises a prefix associated with either an index or the value of the symbol according to the value of the prefix. In the case where the prefix is followed by an index, the prefix designates a group of symbols in the correspondence table and the index specifies the position of the corresponding symbol in the group. Finally, each field of instructions of the executable code is replaced by the corresponding code such as specified in the correspondence table to obtain the program in compressed form.

To optimize the memory space occupied by the compressed program, the codes of variable length are saved one after another without being aligned on memory words. To be able to be decompressed on the fly from an instruction address required by the microprocessor, the program is compressed by blocks of 64 octets (16 instructions of 32 bits), and an index table is generated for directly accessing each compressed block.

This solution may not be optimum in terms of occupation of memory. In fact, it is necessary for each block of compressed instructions to be aligned with the memory words of the addressing space, which leaves at the end of each block unoccupied locations all the greater if the selected blocks are large or all the more numerous if the selected blocks are small. In addition, the index table is relatively voluminous since it occupies 32 bits (4 octets) per block of 64 octets, which significantly penalizes the efficacy of compression.

Further, this solution may degrade performances in terms of speed of execution of the program. This degradation comes from the fact that the compressed instructions are variable in size and thus it is not possible to decompress an instruction of a block prior to having determined the length of the preceding compressed instruction. This solution thus does not conduct certain decompression operations in parallel.

SUMMARY

An embodiment of the present invention eliminates these disadvantages. Specifically, the provision of a compression process of executable code by a microprocessor comprises:

decomposition of the executable code into words, division of the executable code into lines of a predefined number of instructions, compression of each word of each line of executable code in the form of a compressed word of variable length, the compressed words of a line of executable code being collected into a line of compressed words, and constitution of an addressing table for localizing each of the lines of compressed words in a block of lines of compressed words.

According to an embodiment of the invention, the addressing table comprises one input per group of a predefined number of lines of compressed words, each input specifying the position of a first line of compressed words in the block, and the respective lengths of the lines of compressed words of group, except for a last line of compressed words of the group, whereof the length is determined by means of the position of a first line of compressed words of a following group of lines of compressed words.

According to an embodiment of the invention, each word of the executable code is compressed into a part of predefined fixed length, and a part of variable length whereof the length is defined by the part of fixed length, all the parts of fixed length and variable length being combined respectively into a block of parts of fixed length and into the block of compressed words of variable length, each line of executable code being compressed into a line of parts of fixed length and the line of compressed words of variable length.

In an embodiment of the invention, each of the words of the executable code to be compressed advantageously corresponds to an instruction.

Alternatively, the executable code is split into several parts, each containing a respective word of each instruction of the executable code to be compressed, the process being applied separately to each of the parts of executable code, to obtain for each word of instruction of the executable code a part of fixed length which is inserted into the block of parts of fixed length and a part of variable length which is inserted into the block of parts of variable length.

According to an embodiment of the invention, the compression step comprises:

constituting a histogram giving for each distinct word of the executable code a number of occurrences of this word in the executable code, and extracting at least part of the words of the histogram in a decompression table, in which the words are distributed into sub-tables collecting words having numbers of close occurrences in the histogram, each sub-table being associated with a predefined length, the part of fixed length of each word of the executable code referencing a sub-table of the decompression table, and the part of variable length giving a position in the sub-decompression table of the word of the executable code.

According to an embodiment of the invention, the words of the executable code associated in the histogram with a number of occurrences less than a predetermined threshold are not inserted into the decompression table, each word of executable code not inserted into the decompression table being compressed by means of a part of fixed length specifying that the word of executable code does not feature in the decompression table, and a part of variable length containing at least a part of the word of executable code.

According to an embodiment of the invention, if two words of identical executable code appear consecutively in the executable code to be compressed, the second word of executable code is compressed without a part of variable length, by means of a part of fixed length specifying that the word of executable code is the same as the preceding word.

According to an embodiment of the invention, the part of fixed length of each compressed word specifies, according to its value:

either a number of sub-table of the decompression table, or that the word of the corresponding executable code is the second word of two identical consecutive words of the executable code, or that the part of variable length of the compressed word contains at least a part of the word of corresponding executable code.

According to an embodiment of the invention, a predefined value of the part of fixed length of a compressed word specifies a stop point to be introduced to the executable code during a test phase of the program.

According to an embodiment of the invention, the division into sub-tables of the decompression table is selected so as to produce the smallest possible size of the set of parts of variable length of the compressed code.

According to an embodiment of the invention, the executable code is split into several parts, each containing a respective word of each instruction of the executable code to be compressed, the process being applied separately to each of the parts of executable code, to produce a decompression table for each part of the executable code.

An embodiment of the invention likewise relates to a decompression process of executable code by a microprocessor, saved in a program memory zone in compressed form, the process comprising:

determining a reading address of an addressing table as a function of an instruction address to be executed, the addressing table localizing lines of compressed words in a block of lines of compressed words, reading to the reading address in the addressing table addressing information in the block of lines of compressed words, determining a reading address in the block of lines of compressed words as a function of the addressing information read, reading the block of lines of compressed words to the determined reading address, and decompressing at least one read line of compressed words to produce executable instructions.

According to an embodiment of the invention, the addressing table comprises one input per group of a predefined number of lines of compressed words, each input specifying the position of a first line of compressed words in the block, and the respective lengths of the lines of compressed words of the group, except for a last line of compressed words of the group, whereof the length is determined by means of the position of a first line of compressed words of a following group of lines of compressed words.

According to an embodiment of the invention, each word of the executable code is compressed in the form of a part of predefined fixed length and a part of variable length whereof the length is defined by the part of fixed length, all the parts of fixed length and all the parts of variable length of the words of executable code being respectively combined into a block of parts of fixed length and into a block of parts of variable length, at least certain parts of variable length being localized in the block of parts of variable length by means of an addressing table, the decompression process further comprising:

determining a reading address in the block of parts of fixed length as a function of the instruction address to be executed, reading the line of parts of fixed length to the determined addresses, and decompressing the lines of parts of fixed length read to obtain a line of executable instructions.

According to an embodiment of the invention, the part of fixed length of each compressed instruction references a sub-table of a decompression table collecting at least part of the words of the executable code, the part of variable length giving the position in the sub-table of the word of executable code, the decompression of a part of fixed length and a part of corresponding variable length comprising:

determining the length of the part of variable length as a function of the value of the part of corresponding fixed length, reading the part of corresponding variable length in light of the determined length of the part of variable length, and if the part of fixed length references a sub-table of the decompression table, reading the word of executable code in the sub-table of the decompression table referenced by the part of fixed length read at a position defined by the read part of variable length.

According to an embodiment of the invention:

if the part of fixed length indicates that the word of corresponding executable code is a second word of two identical words appearing consecutively in the executable code, the part of fixed length is decompressed by the word of previously decompressed executable code;

if the part of fixed length specifies that the word of corresponding executable code does not feature in the decompression table, the process further comprises the extraction steps of at least part of the word of executable code of the part of corresponding variable length to the part of fixed length; and if the part of fixed length specifies a stop point, a stop point is inserted into the decompressed executable code.

In one embodiment, each of the words of decompressed executable code corresponds to an instruction.

Alternatively, the executable code is split into several parts, each containing a respective word of each instruction of the executable code to be compressed, each part of the executable code having been compressed separately and being associated with a respective decompression table collecting words of executable code of the part of the executable code.

An embodiment of the invention likewise relates to a decompression unit of executable code by a microprocessor, saved in a program memory zone in compressed form, the decompression unit being connected to the microprocessor, the decompression unit comprising:

means for receiving from the microprocessor instruction requests of executable code comprising an instruction address to be executed, means for determining a reading address of an addressing table as a function of the instruction address to be executed, the addressing table localizing in the program memory certain compressed words saved, means for reading to the reading address in the addressing table addressing information of compressed words corresponding to the instruction to be executed, means for determining as a function of the addressing information read a reading address in the block of lines of compressed words in the program memory, corresponding to the instruction address provided by the microprocessor, means for reading the line of compressed words to the address of the determined reading address, means for decompressing the line of compressed words read to produce executable instructions.

According to an embodiment of the invention, the addressing table comprises one input per group of a predefined number of lines of compressed words, each input specifying the position of a first line of compressed words in the block, and the respective lengths of the lines of compressed words of the group, except for a last line of the compressed words of the group, whereof the length is determined by means of the position of a first line of compressed words of a following group of lines of compressed words.

According to an embodiment of the invention, the decompression unit further comprises:

a memory cache for saving a predefined number of decompressed instructions, means for reading the memory cache following receipt of an instruction request sent by the microprocessor, and for transmitting in response the corresponding instructions if they are located in the memory cache.

According to an embodiment of the invention, each word of the executable code is compressed in the form of a part of predefined fixed length and a part of variable length whereof the length is defined by the part of fixed length, all the parts of fixed length and all the parts of variable length of the words of executable code being combined respectively into a block of parts of fixed length and into the block of compressed words of variable length, each line of executable code being compressed into a line of parts of fixed length and the line of compressed words of variable length, the decompression unit further comprising:

means for determining the position in the program memory of the line of parts of fixed length containing the words of compressed code corresponding to the instruction address provided by the microprocessor, means for reading the block of part of fixed length to the reading address determined, means for decompressing the parts of fixed and variable length read to produce an executable instruction, and means for transmitting to the microprocessor the decompressed instruction.

According to an embodiment of the invention, the decompression unit further comprises means for saving starting addresses of the block of parts of fixed length and of the block of parts of variable length of the compressed code, and a starting address of the addressing table.

According to an embodiment of the invention, at least certain parts of fixed length reference a sub-table of a decompression table collecting at least part of the words of the executable code, the part of variable length giving the position in the sub-table of the word of executable code, the decompression unit further comprising:

means for saving a decompression table, means for determining the position of the word of executable code to be read in the decompression table from the part of fixed length and the part of variable length, if the part of fixed length references a sub-table of the decompression table, and means for reading the word of executable code to the positions determined in the sub-table.

According to an embodiment of the invention, the decompression unit further comprises means for transmitting to the microprocessor a word of executable code previously decompressed if the part of fixed length indicates that the word of corresponding executable code is a second word of two identical words appearing consecutively in the executable code.

According to an embodiment of the invention, the decompression unit further comprises means for transmitting to the microprocessor the part of read variable length if the part of fixed length specifies that the word of corresponding executable code does not feature in the decompression table.

According to an embodiment of the invention, the decompression unit further comprises means for transmitting to the microprocessor a stop point of program execution, if the part of fixed length specifies it.

According to an embodiment of the invention, each of the words of decompressed executable code corresponds to an instruction.

According to an embodiment of the invention, the executable code is split into several parts each containing a respective word of each instruction of the executable code to be compressed, each part of the executable code having been compressed separately and being associated with a respective decompression table collecting words of executable code of the part of the executable code.

An embodiment of the invention likewise relates to a microprocessor comprising a decompression unit such as defined hereinabove.

BRIEF DESCRIPTION OF THE DRAWINGS

One or more embodiments of the invention will be described hereinafter, by way of non-limiting example, with reference to the attached diagrams.

DETAILED DESCRIPTION

Figure 1:
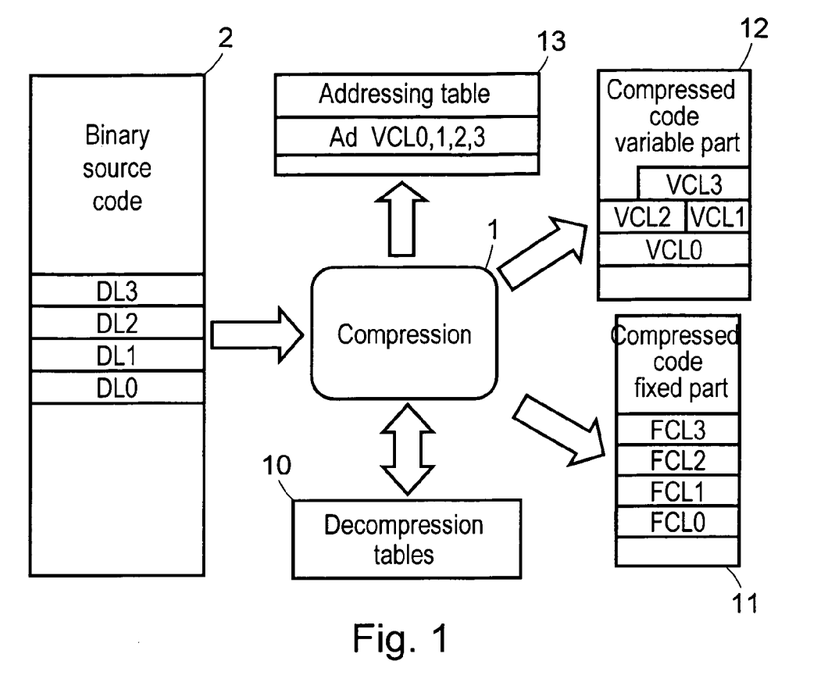
FIG. 1 illustrates a compression system of binary source code, according to an embodiment of the invention.

In FIG. 1, the compression system 1 according to an embodiment of the invention is designed to process binary source code 2, that is, executable by a microprocessor, to produce the compressed code, by using a compression algorithm of "variable length" type, based on the frequency of appearance of the different words in the code to be compressed, short codes being attributed to the most frequent words to be compressed, and longer codes to the least frequent words to be compressed. The selected algorithm originates for example from the Huffman method.

The source code to be compressed is processed by lines DL of 32 or 64 instructions, each line DL producing a line of compressed words of variable length VCL, an addressing table 13 being constituted to be able to directly access at least certain compressed words, without having to read and decompress all the preceding compressed words.

Figure 2:
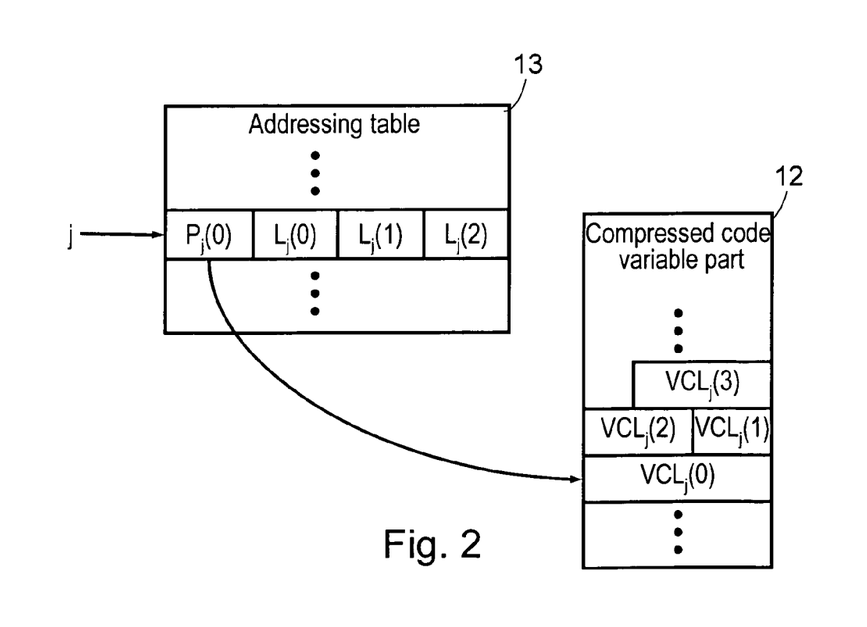
FIG. 2 shows the structure of an addressing table according to an embodiment of the invention obtained during compression.

According to an embodiment of the present invention, the addressing table 13 is structured as illustrated in FIG. 2 in addressing words referencing a group j of several lines of variable parts, for example 4: $VCL_j(0), VCL_j(1), VCL_j(2)$ and $VCL_j(3)$. Each addressing word saved in the addressing table 13 comprises the position $P_j(0)$ in number of bits in the variable part 12 of the start of a first line $VCL_j(0)$, and the lengths $L_j(0), L_j(1), L_j(2)$ in number of bits, of the first, second and third lines $VCL_j(0), VCL_j(1)$ and $VCL_j(2)$.

The respective positions $P_j(1), P_j(2), P_j(3)$ in number of bits of the second, third and fourth lines $VCL_j(1)$ $VCL_j(2)$ and $VCL_j(3)$ are obtained by adding the position $P_j$ and the length $L_j$ of the fixed part of the line preceding:

$$P_j(k)=P_j(k-1)+L_j(k-1), \text{ for } k=1 \text{ to } 3 \quad (1)$$

The length $L_j(3)$ of the fourth line $VCL_j(3)$ is deduced from the position of the first line $P_{j+1}(0)$ specified in the addressing word referencing the group j+1 of the four following lines, and of the position $P_j(3)$ of the fourth group:

$$L_j(3)=P_{j+1}(0)-P_j(3) \quad (2)$$

Each word j of the addressing table 13 comprises for example 64 bits distributed in the different fields in the following manner:
Bits 63 to 33: $P_j(0)$
Bits 32 to 22: $L_j(0)$
Bits 21 to 11: $L_j(1)$
Bits 10 to 0: $L_j(2)$ The addressing table 13 thus directly accesses a line VCL of variable parts of compressed instructions. In comparison to the addressing tables described in U.S. Pat. No. 6,199,126 (which is incorporated by reference), the addressing table according to an embodiment of the invention addresses four lines of 32 or 64 instructions of 32 bits by means of words of 64 bits, which increases in a relatively low measure the size of the compressed code.

Each word of the compressed executable code is decomposed in the form of a part of fixed length and a part of variable length. Next, all the parts of fixed length are combined into a block 11 of compressed instructions of fixed length, and all the parts of variable length are combined into a block 12 of compressed parts of variable length, the addressing table 13 accessing at least certain compressed words combined into the block 12 of compressed parts of variable length, without having to read and decompress all the preceding parts in the block.

When the source code to be compressed is processed by lines DL of 32 or 64 instructions, each line DL thus produces a line of fixed parts FCL and a line of variable parts VCL.

In this way, the position in memory of the fixed part of an instruction can be determined directly as a function of the instruction address in the executable code, thus allowing the decompression to process in parallel the parts of fixed and variable length.

Figure 3:
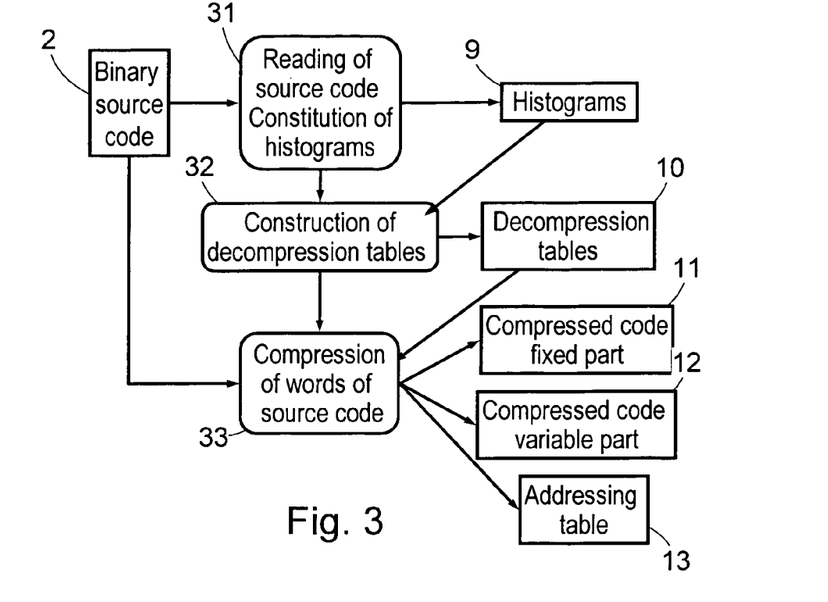
FIG. 3 shows in greater detail in the form of an organigram a sequence of compression procedures executed by the system illustrated in FIG. 1 according to an embodiment of the invention.

The selected compression algorithm for example complies with that illustrated in FIG. 3. In the first step 31 of this algorithm, the system 1 reads the binary source code to constitute a histogram giving for each distinct word of the source code a number of occurrences in the source code of this word. This histogram is constituted by a table ordered by a decreasing number of occurrences.

In the following step 32, the system constructs a decompression table 10 extracted from the histogram by collecting all the distinct associated words in the histogram to a number of occurrences greater than a predefined threshold. The order of the words in the decompression table corresponds to that of the words in the histogram. The decompression table is then divided into sub-tables collecting words having numbers of close occurrences, that is, whereof the position in the sub-table will be coded by the same number of bits.

In the following step 33, the binary source code 2 is read again, to compress each word of the binary code in the form of a part of fixed length, constant for all the words of the executable code to be compressed, and a part of variable length from one word to the other. There are two cases according to which the word to be compressed is or is not in the compression table.

Figure 4:
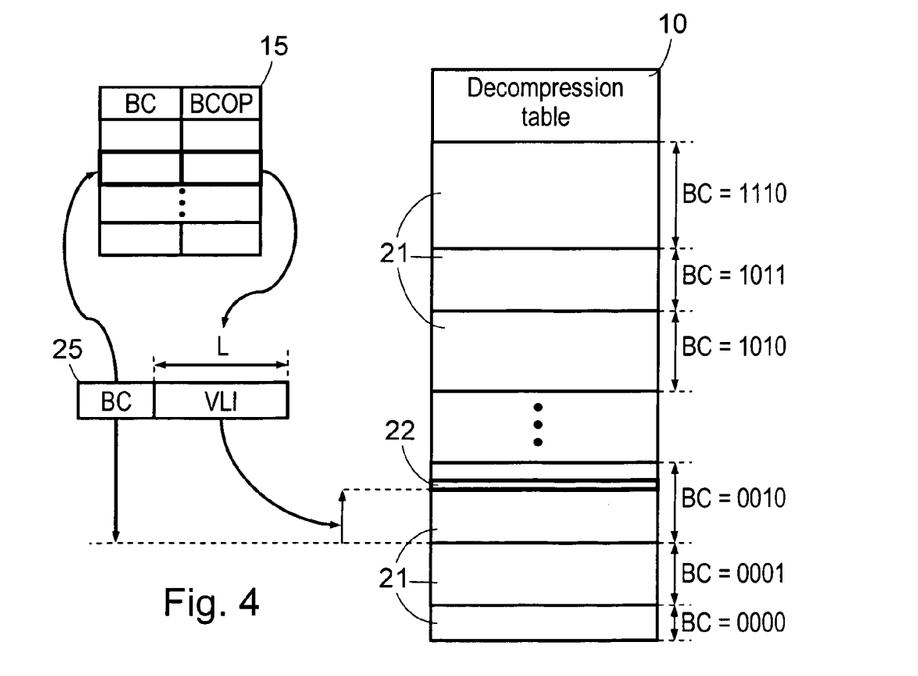
FIG. 4 shows the structure of a decompression table obtained during compression carried out according to the sequence of procedures illustrated in FIG. 3 according to an embodiment of the invention.

If the word to be compressed is in the compression table 10, the compression principle illustrated by FIG. 4 which shows the decompression table 10 divided into sub-tables 21, each referenced by a respective BC code, is applied. According to this principle, the fixed part of the word 25 resulting from the compression contains the sub-table BC code of the decompression table 10 in which the word 22 is found in the decompressed state, and the variable part indicates the position VLI of this word in the sub-table in the example of FIG. 4, the sub-table BC code is coded on 4 bits, so as to reference as many as 16 sub-tables. In practice, certain values of the BC code will have to be reserved for other usages such as coding the words of the source code not present in the compression table 10.

If the word to be compressed is not in the compression table 10, the fixed part of the word resulting from compression contains a number BC not attributed to a sub-table 21, reserved for this effect, and the variable part contains the word to be compressed.

If two values of the BC code can be reserved for coding the words to be compressed not in the compression table, a bit in the coding of the word can be won by considering that a bit of the BC code determines a bit of the word to be compressed. For example, the least significant bit of the BC code is equal to the most significant bit of heavy weight of the word to be compressed.

A value of the BC code is reserved for specifying that the word to be compressed is the same as the preceding word. In this way, if the source code to be compressed comprises two identical successive words, the second word is coded without variable part, in the form of a single fixed part including the reserved BC code, specifying that the word of the source code is the same as the preceding word.

The division of the decompression table 10 into sub-tables 21 is completed so as to minimize the size of the compressed code and in particular the size of the variable part 12 of the compressed code, knowing that the length of the fixed part 11 of the compressed code depends on the number of instructions featuring in the source code to be compressed and on the length (in number of bits) selected for the BC code.

The BC code has the following functions: either it specifies a sub-table number, or it introduces a word of the non-compressed code, or it specifies that the word which it codes is identical to the preceding word. Provision can further be made to reserve a value of the BC code for introducing stop points to the binary source code during a test phase of the program.

The function of the BC code as a function of its value is advantageously defined in a table 15 indexed as a function of the value of BC, specifying either the length L in number of bits of the variable part VLI when BC specifies a number of sub-table 21, or the length of the non-compressed word when BC introduces a non-compressed word, or when the word introduced by the BC code is identical to the preceding word, or when the value of corresponding BC is a stop point.

The size T of the variable part 12 of the compressed code is obtained by the following formula:

$$T = \sum_{i=0}^{N-1} V_i \cdot \sum_{j=H_i}^{H_{i+1}} O_j + (M - H_N) \cdot V_{literal} \quad (3)$$

in which:

N is the number of sub-tables 21 in the decompression table 10, $V_i (0 \leq i < N)$ is the number of bits selected for the coding of the position of a word in the sub-decompression table i (is directly linked to the number of words listed in the sub-table i), $H_i$ is the position in the decompression table i (or in the histogram) of the first word of the sub-table i, $O_j$ is the number of occurrences of the $j^{th}$ word of the decompression table (or of the histogram), such as provided in the histogram 9, M is the number of words in the histogram, $H_N$ is the size in number of words of the decompression table, or the position of the first word in the histogram which does not feature in the decompression table, and $V_{literal}$ being the length of coding of a word of the code to be compressed was not found in the decompression table.

$H_N$ can be calculated by means of the following formula:

$$H_N = \sum_{i=0}^{N-1} 2^{V_i} \quad (4)$$

If S is the maximum size reserved for the decompression table 10, $H_N \leq S$.

If two values of the BC code can be reserved for coding the words to be compressed not in the compression table, formula (3) becomes:

$$T = \sum_{i=0}^{N-2} V_i \cdot \sum_{j=H_i}^{H_{i+1}} O_j + (M - H_N) \cdot (V_{literal} - 1) \quad (5)$$

In similar fashion, if a value of the BC code can be reserved for specifying that the word to be compressed is the same as the preceding word, the formula (3) becomes:

$$T = \sum_{i=0}^{N-2} V_i \cdot \sum_{j=H_i}^{H_{i+1}} O'_j + (M - H_N) \cdot V_{literal} \quad (6)$$

The histogram is modified because two identical consecutive words count only as one for the number of occurrences of this word. This results in considering a new histogram and a number of occurrences $O'_j$.

By combining the two preceding conditions (reservation of two values of the BC code for coding the words to be compressed not found in the compression table and a value of the BC code for specifying that the word to be compressed is the same as the preceding word), the formula (1) becomes:

$$T = \sum_{i=0}^{N-3} V_i \cdot \sum_{j=H_i}^{H_{i+1}} O'_j + (M - H_N) \cdot (V_{literal} - 1) \quad (7)$$

Using formulas (3), (5), (6) and (7), T applied to the code to be compressed is calculated for all possible partitions of the decompression table into sub-tables, that is, for all possible values of $H_i$, by imposing that $V_i \leq V_{i+}$, that is, that the size of the sub-table i is less than or equal to that of the sub-table i+1. The selected partition of the decompression table into sub-tables is what produces a size T of minimum variable part. The components $V_i$ of the compression model are thus determined.

Figure 5:
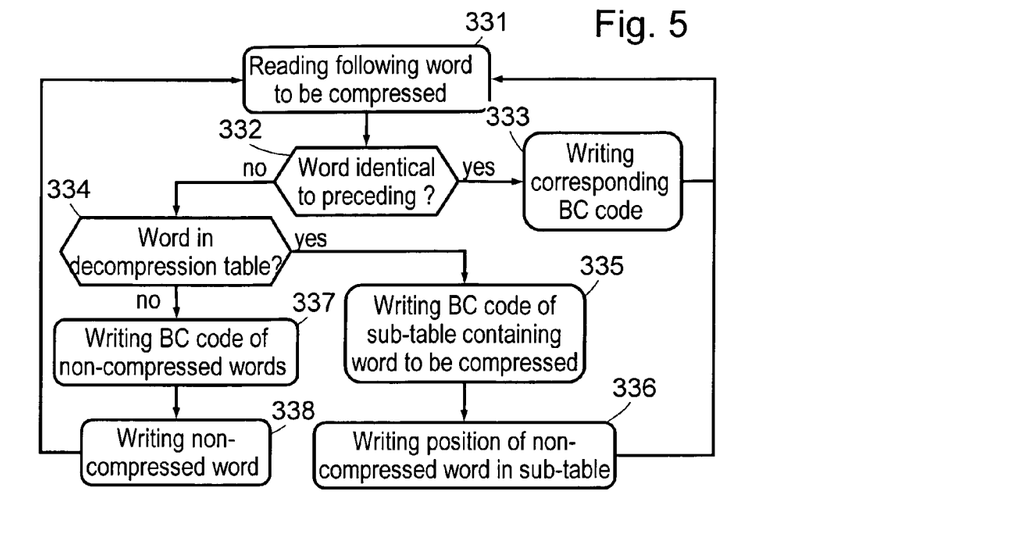
FIG. 5 shows in greater detail in the form of an organigram a step of the compression process illustrated in FIG. 3 according to an embodiment of the invention.

The compression procedure 33 of the words of the code to be compressed is illustrated in FIG. 5. In the first step 331 of this procedure, the following word of the code to be compressed is read. If this word is identical to the preceding word (step 332), the BC code corresponding in the compressed code is written to step 333, then follows step 331 for reading the following word to be compressed.

If the word to be compressed is not identical to the previous one, it is determined in step 334 if the word to be compressed figures in the decompression table 10. If such is the case, the BC code corresponding to the sub-table 21 is inserted at step 335 where the word to be compressed in the compressed code is found. Next, the position of the word to be compressed in the sub-table 21 (step 336) is inserted into the compressed code, and step 331 follows.

If the word to be compressed does not feature in the decompression table 10, the corresponding BC code (step 337) is inserted into the compressed code, then the word to be compressed or a part thereof if the selected BC code specifies the non-inserted bits of the word to be compressed (step 338).

Each instruction of the binary source code to be compressed can be split into several words so as to reveal more repetitions in the words to be compressed. As many decompression tables as there are words in each instruction are made up. Therefore, for example, in the case of a binary code executable by a microprocessor with RISC architecture constituted by instructions coded on 32 bits, each instruction is split into two words, namely a word of heavy weight and a word of light weight, for example of lengths equal to 16 bits. These words are processed separately to constitute two respective histograms, one for the words of light weight and one for the words of heavy weight. Each of these histograms results in two decompression tables and compression of the source code to be compressed provides two fixed parts and two variable parts for each instruction of the executable code.

Figure 6:
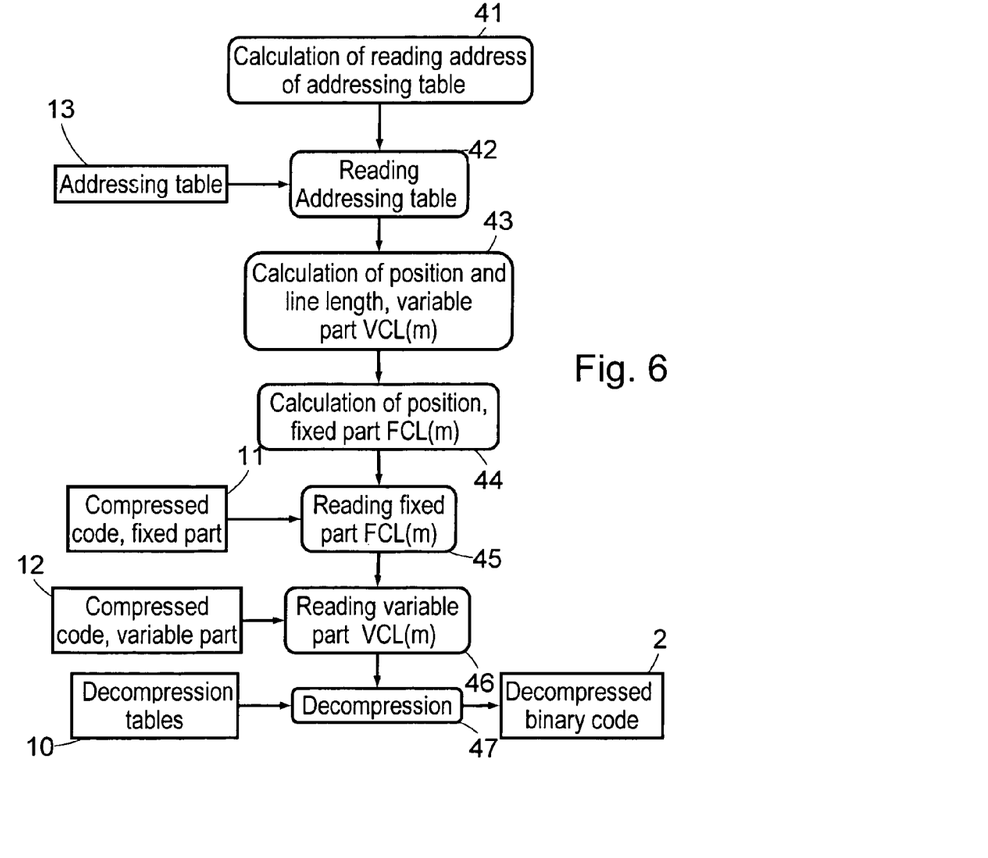
FIG. 6 illustrates in the form of an organigram a decompression process according to an embodiment of the invention.

FIG. 6 illustrates the decompression process corresponding to the compression process described hereinabove with reference to FIG. 3 according to an embodiment of the invention.

In the first step 41 of this process, an address j for reading the addressing table 13 is calculated from the address AD of a first instruction to be executed. This step first of all comprises determining the address m of the line of instructions DL(m) containing the instruction from which the decompression processing must be carried out. This calculation is done by means of the following formula:

$$m=(AD-AD_S)/DLS \quad (8)$$

in which $AD_S$ is the starting address of the compressed program and DLS is the length of a line of instructions.

The line j of 64 bits to be read in the addressing table is obtained by dividing m by the number of lines DL referenced by line j of the addressing table, or 4 in the example described previously.

In the following step 42, the line j identified in the addressing table 13 is read, then the position of the line of instructions VCL(m) in the variable part 12 of the compressed code is determined, and the number of words to be read to produce all the compressed code of the line of instruction of variable length (step 43).

The position P(m) of the line m to be read in the variable part 12 is obtained in the following way:

if k=m modulo 4=0, $$P(m)=P_j(0), \quad (9)$$

unless, if k=1, 2 or 3, $$P(m)=P_j(k-1)+L_j(k-1). \quad (10)$$

Once it has been identified to which line m belongs, the variable part of the instruction to be read the number F of words (of 32 bits) to be read in the variable part is determined as a function of the number of line m, by means of the following formula:

$$F(m)=1+(L_j(k)-1)/32 \quad (11)$$

In the following step 45, the fixed part FCL(m) of the line of compressed code DL(m) is read. Knowing that the fixed part of a compressed instruction is coded on 8 bits (if the BC codes are defined on 4 bits and if each instruction is decomposed into two words of 16 bits codes separately), the position $P_F$ in octets of the line of code in the compressed fixed part 11 is given the value m. The length of the fixed part FCL(m) is 32 or 64 octets according to the length of a line.

In the following step 46, the variable part VCL(m) of the line of compressed code is read, determined at step 44. Of course, steps 44 and 45 on either side of 42, 43 and 46, can be taken in any order or in parallel.

Finally, in the final step 47, the line of compressed code is decompressed by means of the decompression tables to produce a line of executable code 2'. To this effect, each BC code of the line of fixed length FCL(m) is read, the function of the BC code is determined by accessing the field BCOP<BC> in the table 15, if the function of the BC code specified in the table 15 indicates that the corresponding instruction is the same as the preceding instruction, the previously decompressed instruction is duplicated in the decompressed code 2'. If the function of the BC code specified in the table 15 is to introduce a non-compressed variable part of 15 or 16 bits, the following 15 or 16 bits in the variable part VCL(m) are read respectively and are written into the decompressed code 2'. If the length of the variable part is 15 bits, the most significant bit (16th bit) is equal to the least significant bit of the BC code. If the function of the BC code is to reference a sub-table of the decompression table 10, the address of the corresponding sub-table 21 in the decompression table is determined, and the length VLI of the variable part to be read in the line of variable parts VCL(m), such as specified in the table 15. The following VLI bits in the variable part VCL(m) are read to produce a position to be read in the decompression table 10 from the address of the sub-table 21 corresponding to the BC code. Finally, the word 22 found at the position thus determined in the sub-decompression table 21 is read, the read word being inscribed in the decompressed code 2'.

Figure 7:
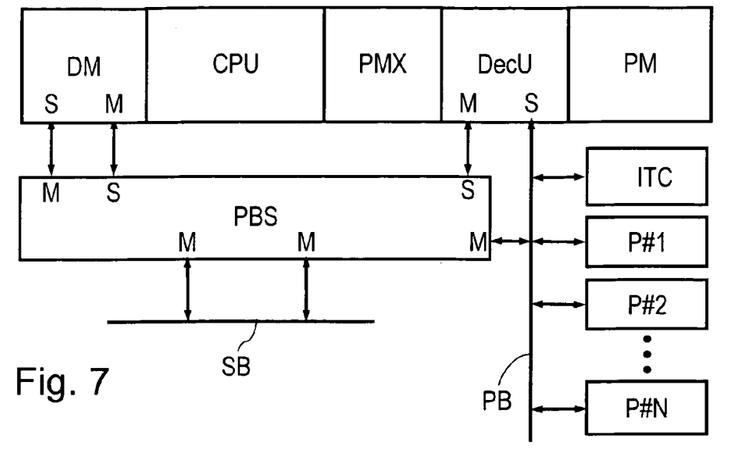
FIG. 7 schematically represents the architecture of a calculator comprising a decompression unit according to an embodiment of the invention.

The decompression process which has just been described is adapted to be carried out on the fly at the moment of execution of a program by a microprocessor or microcontroller. FIG. 7 schematically illustrates an example of architecture of an integrated circuit comprising such a microprocessor. In this figure, the microprocessor comprises a central unit CPU coupled directly to an access unit DM with data memory, and to an access unit with PMX program memory designed to accelerate reading the instructions to be executed in a PM program memory with rapid access or optionally in other memories, accessible by means of a peripheral bus PB, to which are connected an administration unit for ITC interruptions and peripheral elements P#1, P#2, . . . , P#N such as memories. The integrated circuit further comprises a PBS bus switch forming a link between the microprocessor, and in particular the access unit DM with data memory, and the PMX access unit with program memory and a SB bus access system with external memories and external interfaces.

Figure 8:
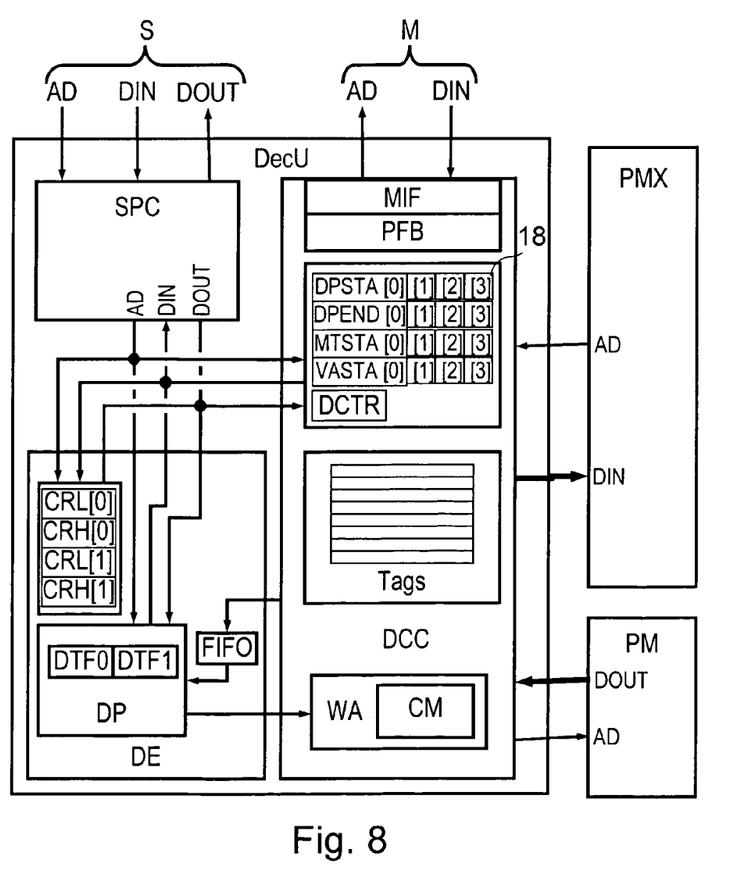
FIG. 8 schematically represents the architecture of the decompression unit shown in FIG. 7 according to an embodiment of the invention.

According to an embodiment of the invention, the microprocessor comprises a DecU decompression unit for decompressing on the fly of the executable code saved in the program memory in compressed form obtained due to the compression process described hereinabove. To this end, the decompression unit is interposed between the access unit with PMX program memory on either side, the PM program memory, the PBS bus switch and the PB peripheral bus. An example of architecture of the decompression unit is represented in FIG. 8. In this figure, the DecU decompression unit comprises an SPC slave port control circuit charged with communications with the PB peripheral bus and initialization of the DecU decompression unit, a DE decompression motor charged with processing of decompression per se, and a DCC memory cache control circuit.

The DE decompression motor comprises CRL, CRH registers for receiving the table 15 for giving the function of the BC code for each of the values of this code. The decompression motor further comprises a DP processing unit collecting in DTF registers the decompression tables 10. If the instructions of code are split into two words, two tables 15 saved into four registers CRL[0], CRL[1], CRH[0], CRH[1] are provided, and two decompression tables saved respectively into two DTF0 and DTF1 registers. More generally, two CRL, CRH registers and a DTF register for each compressed word separately from the instructions of the executable code are provided. The DP processing unit has a pipeline architecture, that is, it can carry out in parallel several operations normally conducted in series.

The DCC memory cache control circuit comprises:
an MIF master bus interface designed to be connected to the PBS bus switch,
a PFB input buffer memory connected to the MIF interface,
a set of registers 18 provided to receive addresses accessing the different parts of the compressed code saved in the program memories, namely the fixed 11 and variable 12 parts of the compressed code and the addressing tables 13,
a DCTR control register of the decompression unit,
a WA memory work zone comprising a CM memory cache, and
an administration Tags table of the CM memory cache containing the addresses of the most recent decompressed instructions saved in the CM memory cache.

The SPC circuit comprises an AD input address port, and DIN and DOUT data input and output ports connected to the PB peripheral bus, especially for receiving from the CPU by way of the PBS bus switch the data to be loaded into the different registers described hereinabove of the decompression unit for carrying out decompression processing. It is likewise responsible for conducting the tests for proper running of the DecU decompression unit and in particular to test the content of the registers.

Figure 9:
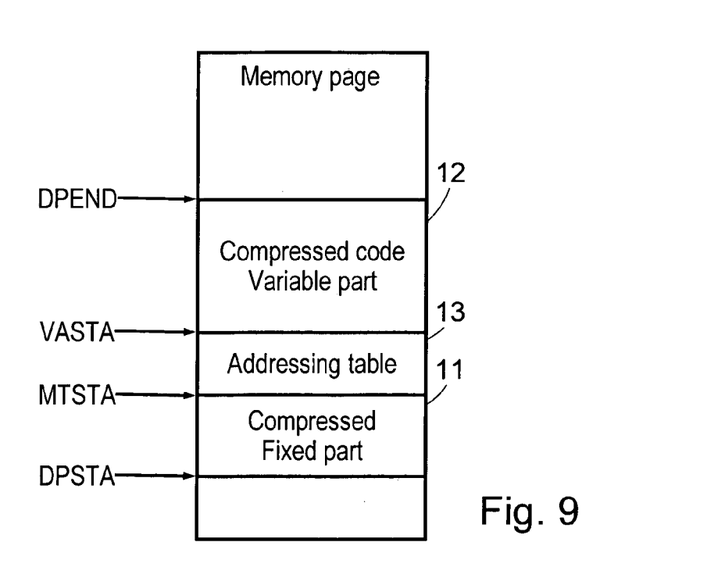
FIG. 9 shows the structure of a memory page of compressed program, according to an embodiment of the invention.

The compressed code is distributed in the program memory in pages of compressed code, each page collecting a fixed part 11 and a variable part 12 of compressed code, and an addressing table 13. The set of registers 18 is thus provided for receiving for each page of compressed code a set of addresses comprising page starting and finishing addresses of compressed DPSTA and DPEND code, a starting MTSTA address for addressing table 13, and a starting VASTA address of variable part 12 of the compressed code, the fixed part 11 of the compressed code extending for example from the DPSTA starting address, as illustrated in FIG. 9.

Figure 10:
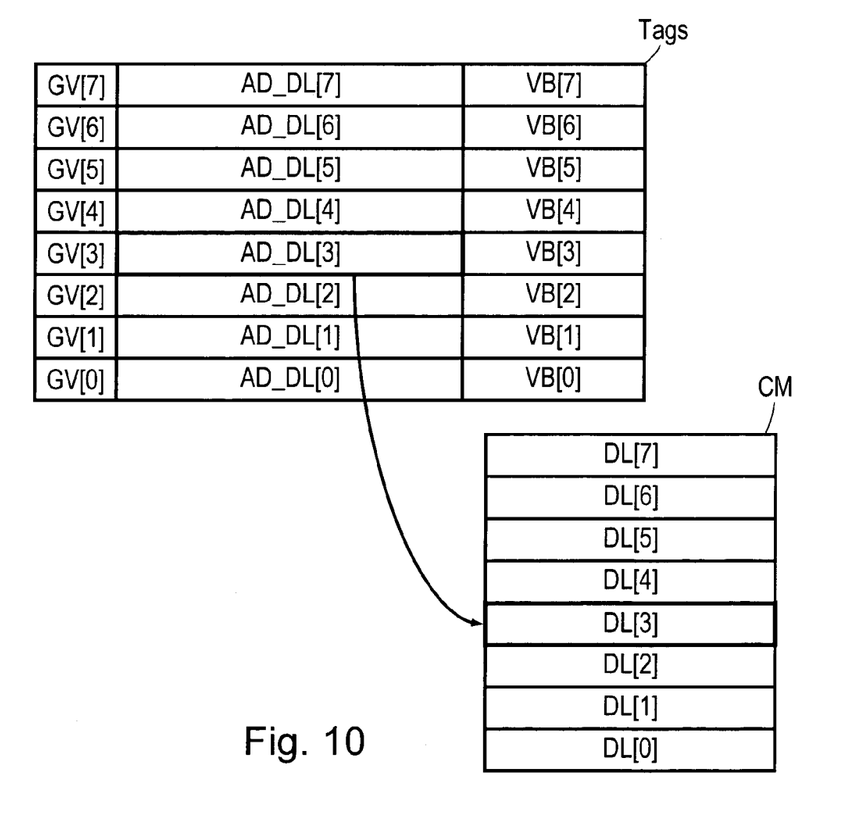
FIG. 10 shows the structure of an administration table of memory cache of the decompression unit shown in FIG. 8 according to an embodiment of the invention.

As is shown in FIG. 10, the Tags table aids in addressing 8 DL lines of decompressed instructions. Each line i of this table, which corresponds to a line i of the CM memory cache, contains the AD_DL[i] address of the decompressed line in the addressing plane of the CPU, associated with a global validity bit GL[i], and a set of validity bits VB[i], by way of one validity bit per group of 4 decompressed instructions in the DL[i] line of the CM memory cache.

The control circuit of DCC memory cache is provided to connect directly to the access unit to the PMX program memory and to the PM rapid program memory. Accordingly, the DCC circuit comprises an address input connected to an AD output address of the PMX unit for receiving from the latter a starting address of instructions to be decompressed originating from the CPU, and a data output connected to a DIN input of the PMX unit by which the DCC circuit transmits the corresponding decompressed instructions in response. The DCC circuit likewise comprises an address output and a data input connected respectively to an AD address input and a DOUT data output of the PM rapid program memory, for receiving a line of compressed instructions from the address provided. When the address received from the PMX unit is not found in the rapid program memory, the DCC control circuit accesses the external program memory by means of the MIF interface comprising an output address port and an input data port connected to the PBS bus switch.

Each address received as an instruction request from the CPU by means of the PMX unit refers to a group of four successive instructions. On receipt of such a request, the DCC control circuit searches to see if the address of the group of required instructions features in the AD_DL[i] fields of the Tags table. The DCC control circuit considers that the required instructions are decompressed in the CM memory cache if the required address is in the Tags table and if the corresponding global validity bit GL[i] is raised, and if this bit is not raised, if the validity bit VB[i][j] corresponding to the group j of required instructions is raised. If the group of required instructions features in the memory cache, the DCC control circuit reads the group of required instructions in the corresponding field i of the memory cache, the transmits to the PMX unit. It is then available for receiving a fresh request from the CPU.

In the case where the group of required instructions is not decompressed in the memory cache, the DCC control unit determines if the group of required instructions belongs or not to the field of addresses of the compressed code, that is, if the address of the group of required instructions is between the DPSTA[i] and DPEND[i] addresses of the page of code to which the address of the group of required instructions belongs. If this is not the case, the control unit accesses the PM program memory or an external memory via the master port, the address of the group of required instructions and transmits the read instructions to the PMX unit.

If the group of required instructions belongs to the field of addresses of the compressed code, the DCC control unit determines a line i of the Tags table and of the CM memory cache which it can utilise for inserting the new line of decompressed code which it is about to generate. The selected line i is for example that which was read the most recently. Next, the DCC control unit executes the decompression procedure such as described hereinabove with reference to FIG. 6. In particular, in steps 45 and 46, the DCC control unit supplies the read fixed FCL(m) and variables VCL(m) parts to the DE decompression motor, for example by means of a FIFO (First In First Out) buffer memory. As long as the FIFO is not empty, the DE decompression motor executes the step 47 decompression as such. For this purpose, it reads the fixed and variable parts of the first line introduced to the FIFO, reads the BC codes of the fixed part, successively or two by two if the compressed instructions have been split into two words, and decompresses each instruction. The decompressed instructions are provided to the DCC control unit which loads them into the line i of the CM memory cache selected previously, and discloses the Tags table, and in particular the VB[i] validity bits corresponding to the line of the memory cache, each time a group of four decompressed instructions is written in the memory cache. When an entire line of decompressed instructions is inscribed in the memory cache, the control unit discloses the GV[i] global validity bit corresponding to the line.

In parallel to this, as soon as the validity bit VB[i] of the group of instructions corresponding to the address received as an instruction request from the CPU is raised, the control unit transmits the corresponding group of instructions located in the CM memory cache to the PMX unit so that it is provided to CPU, and waits for a fresh instruction request originating from the CPU.

In parallel to this, another memory cache for storing the read words in the addressing table 13 can likewise be utilized.

Because of these arrangements, if the CPU asks for instructions featuring in the CM memory cache, it is not necessary to carry out decompression processing. Numerous processing cycles are thus economized, and the bus system is left free for other tasks.

Another result of the preceding description is that the compression and decompression algorithms according to an embodiment of the invention produce considerable flexibility, in terms of the possibility of conducting different decompression operations in parallel, while offering a high compression rate. Therefore, an embodiment of the invention offers a compression rate typically between 30 and 45%, without augmenting the number of cycles of execution of the code by more than 5%, when a memory cache is used for storing the decompressed instructions.

An electronic system, such as a computer system, may incorporate a microprocessor such as discussed above in conjunction with FIGS. 7-10.

From the foregoing it will be appreciated that, although specific embodiments of the invention have been described herein for purposes of illustration, various modifications may be made without deviating from the spirit and scope of the invention.

The invention claimed is:

1. A compression process for executable code by a microprocessor, comprising:
    decomposition of the executable code into words,
    division of the executable code words into lines of a predefined number of instructions,
    decomposition of each line of executable code into a first executable part and a second executable part;
    compression of each first executable part into a first compressed part having a fixed length and compression of each second executable part into a second compressed part having a variable length, said variable length being defined by said first compressed part, all of said first compressed parts being stored in a first group of blocks and all of said second compressed parts being stored in a second group of blocks,
    creating an addressing table for providing an address for each of said second compressed parts, wherein the addressing table comprises one input per block of second compressed parts, each input specifying the position of a second compressed part in said block and further specifying the respective lengths of each compressed part in the block except for the last such compressed part in the block, the length of such part being determined by the position of the second compressed part in a following block.

2. The compression process as claimed in claim 1, in which each of the words of the executable code to be compressed corresponds to an instruction.

3. The compression process as claimed in claim 1, in which the executable code is split into several parts, each containing a respective word of each instruction of the executable code to be compressed, the process being applied separately to each of the parts of executable code, to produce for each word of instruction of the executable code a part of fixed length which is inserted into the first group of blocks and a part of variable length which is inserted into the second group of blocks.

4. The compression process as claimed in claim 1, in which the compression step further comprises:
    creating a histogram giving for each distinct word of the executable code a number of occurrences of this word in the executable code, and
    extracting at least part of the words of the histogram into a decompression table, in which the words are distributed into sub-tables collecting words having numbers of close occurrences in the histogram, each sub-table being associated with a predefined length,
    the part of fixed length of each word of the executable code referencing a sub-table of the decompression table, and the part of variable length giving a position in the decompression sub-table of the word of the executable code.

5. The compression process as claimed in claim 4, in which the words of the executable code associated in the histogram with a number of occurrences of less than a predetermined threshold are not inserted into the decompression table, each word of executable code not inserted into the decompression table being compressed by means of a part of fixed length specifying that the word of executable code does not feature in the decompression table, and a part of variable length containing at least a part of the word of executable code.

6. The compression process as claimed in claim 4, in which if two words of identical executable code appear consecutively in the executable code to be compressed, the second word of executable code is compressed without part of variable length, by means of a part of fixed length specifying that the word of executable code is the same as the preceding word.

7. The compression process as claimed in claim 4, in which the part of fixed length of each compressed word specifies according to its value:
    either a number of sub-table of the decompression table,
    or that the word of the corresponding executable code is the second word of two identical consecutive words of the executable code,
    or that part of variable length of the compressed word contains at least a part of the word of corresponding executable code.

8. The compression process as claimed in claim 7, in which a predefined value of the part of fixed length of a compressed word specifies a stop point to be introduced to the executable code during a test phase of the program.

9. The compression process as claimed in claim 4, in which the division into sub-tables of the decompression table is selected to produce a size of the set of parts of the smallest possible variable length of the compressed code.

10. The compression process as claimed claim 4, in which the executable code is split into several parts, each containing a respective word of each instruction of the executable code to be compressed, the process being applied separately to each of the parts of executable code, to produce a decompression table for each part of the executable code.

11. A decompression process of executable code by a microprocessor, the process comprising:
    determining a reading address of a line of compressed words of fixed length from a first block as a function of the address of an instruction to be executed,
    reading the line of compressed executable words of fixed length at the determined address, determining a reading address of an addressing table as a function of the instruction address to be executed, the addressing table providing an address for lines of compressed words of variable length within a second block of lines of compressed words except the last compressed word in the second block of lines reading from the reading address in the addressing table addressing information in the second block, determining as a function of the read addressing information a reading address in the second block, reading the second block at the reading address determined, and decompressing at least one line of compressed executable words of variable length and one line of compressed executable words of fixed length to produce a line of executable instructions.

12. The decompression process as claimed in claim 11, wherein the addressing table comprises one input per block of compressed words of variable length, each input specifying the position of a first line of compressed words in each such block, further specifying the respective lengths of all of the lines of compressed words in the block except for a last such line, the length of said line being determined by the position of the first line of compressed words in a following block.

13. The decompression process as claimed in claim 11, in which the part of fixed length of each compressed instruction references a sub-table of a decompression table collecting at least part of the words of the executable code, the part of variable length giving the position in the sub-table of the word of executable code, the decompression of a part of fixed length and a part of corresponding variable length comprising:

determining the length of the part of variable length as a function of the value of the part of corresponding fixed length, reading the corresponding part of variable length considering the determined length of the part of variable length, and if the part of fixed length references a sub-table of the decompression table, reading the word of executable code in the sub-table of the decompression table referenced by the read part of fixed length, to a position defined by the part of variable length read.

14. The decompression process as claimed in claim 13, in which:

if the part of fixed length indicates that the word of corresponding executable code is a second word of two identical words appearing consecutively in the executable code, the part of fixed length is decompressed by the word of executable code previously decompressed;

if the part of fixed length specifies that the word of corresponding executable code does not feature in the decompression table, the process further comprises extraction steps of at least part of the word of executable code of the part of variable length corresponding to the part of fixed length; and if the part of fixed length specifies a stop point, a stop point is inserted into the decompressed executable code.

15. The decompression process as claimed in claim 11, in which each of the words of decompressed executable code corresponds to an instruction.

16. The decompression process as claimed in claim 13, in which the executable code is split into several parts, each containing a respective word of each instruction of the executable code to be compressed, each part of the executable code having been compressed separately and being associated with a respective decompression table collecting words of executable code of the part of the executable code.

17. A computer-readable storage medium having a unit of executable code by a microprocessor, comprising:

means for compressing each word of the executable code into the form of an executable part of predefined fixed length and an executable part of variable length whereof the length is defined by the part of fixed length, all the parts of fixed length and all the parts of variable length being combined respectively into a block of parts of fixed length and into a block of parts of variable lengths, each line of executable code being compressed into a line of parts of fixed length and a line of parts of variable length, means for receiving from the microprocessor instruction requests of executable code comprising an instruction address to be executed, means for determining the position in the program memory of the line of parts of fixed length containing the words of compressed code corresponding to the instruction address provided by the microprocessor, means for reading the block of parts of fixed length to the determined reading address, means for determining a reading address of an addressing table as a function of the instruction address to be executed, the addressing table localising lines of compressed words of variable length into a second block of lines of compressed words saved in the program memory, means for reading to the reading address in the addressing table addressing information in the second block of lines of compressed words, means for determining as a function of the read addressing information a reading address in said second block of lines of compressed words and a length of a line of compressed words in the program memory, corresponding to the instruction address provided by the microprocessor, means for reading the line of compressed words to the reading address determined, means for decompressing the parts of fixed and variable length read to produce an executable instruction, and means for transmitting the decompressed instruction to the microprocessor, wherein the addressing table comprises one input per group of a predefined number of lines of compressed words, each input specifying the position of a first line of compressed words in the block, and the respective lengths of the lines of compressed words of the group, except for a last line of compressed words of the group, the length of such line being determined by means of the position of a first line of compressed words from a following group of lines of compressed words.

18. The computer-readable storage medium as claimed in claim 17, further comprising:

means for saving a predefined number of decompressed instructions, means for reading the memory cache following receipt of an instruction request sent by the microprocessor, and for transmitting in response the corresponding instructions if they are located in the memory cache.

19. The computer-readable storage medium as claimed in claim 17, further comprising means for storing starting addresses of the block of parts of fixed length and of the block of parts of variable length of the compressed code, and a starting address of the addressing table.

20. The computer-readable storage medium as claimed in claim 17, in which at least certain parts of fixed length reference a sub-table of a decompression table collecting at least part of the words of the executable code, the part of variable length giving the position in the sub-table of the word of executable code, the decompression unit further comprising:
   means for saving a decompression table,
   means for determining the position of the word of executable code to be read in the decompression table from the part of fixed length and from the part of variable length, if the part of fixed length references a sub-table of the decompression table, and
   means for reading the word of executable code to the position determined in the sub-table.

21. The computer-readable storage medium as claimed in claim 20, further comprising means for transmitting to the microprocessor a word of executable code previously decompressed if the part of fixed length indicates that the word of corresponding executable code is a second word of two identical words appearing consecutively in the executable code.

22. The computer-readable storage medium as claimed in claim 20, further comprising means for transmitting to the microprocessor the read part of variable length if the part of fixed length specifies that the word of corresponding executable code does not feature in the decompression table.

23. The computer-readable storage medium as claimed in claim 20, further comprising means for transmitting to the microprocessor a stop point of program execution, if the part of fixed length specifies it.

24. The computer-readable storage medium as claimed in claim 17, in which each of the words of decompressed executable code corresponds to an instruction.

25. The computer-readable storage medium as claimed in claim 20, in which the executable code is split into several parts, each containing a respective word of each instruction of the executable code to be compressed, each part of the executable code having been compressed separately and being associated with a respective decompression table collecting words of executable code of the part of the executable code.

26. A method, comprising:
   storing first and second groups of first executable code word parts in a first series of sequential locations of a memory, each of said first code word parts having a respective length, the respective length of one of said first code word parts being different than the respective length of at least another one of said first code word parts;
   storing in a second series of sequential locations of the memory a group of second executable code word parts, each of said second code word parts having a same length and corresponding to one of the code word parts in either of said first or second groups of first code word parts, wherein the combination of a first code word part with the corresponding second code word part comprises a code word,
   storing in an address table the respective starting location of the first group and the respective lengths of all of said first code word parts in the first group except for the last such code word part in said first group; and
   storing in the address table the respective starting location of the second group and the respective lengths of the all the code word parts in the second group except for the last code word part in the second group.

27. The method of claim 26 wherein each of the code words represents respective software-program instruction.

28. The method of claim 26, further comprising converting programming instructions into the code words.

29. The method of claim 26, further comprising:
   converting programming instructions into code words that include the first and second groups of first code word parts, each instruction occurring with a respective frequency;
   wherein each code word has a respective length that is related to the frequency of the programming instruction corresponding to the code word.

30. The method of claim 26, further comprising:
   converting programming instructions into code words that include the first and second groups of code word parts, each instruction occurring with a respective frequency;
   wherein each code word has a respective length that is inversely proportional to the frequency of the programming instruction corresponding to the code word.

31. The method of claim 26 wherein one of the code words includes a base address and an index that together point to a respective decoded value that corresponds to the one code word.

32. The method of claim 26 wherein one of the first code word parts indicates that an immediately preceding first code word part represents a same decoded value as the one first code word part.

33. The method of claim 26 wherein one of the code words includes a portion that indicates that a remaining portion of the one code word includes a decoded value represented by the one code word.

34. An electronic system, comprising:
   a memory including a code portion and an address table; and
   a processor coupled to the memory and operable to
      store in sequential locations of the code portion first and second groups of first executable code word parts, each of said first code word parts having a respective length, the respective length of one of said first code word parts being different than the respective length of at least another one of said first code word parts,
      store in a second series of sequential locations of the code portion a group of second executable code word parts, each of said second code word parts having a same length and corresponding to one of the code word parts in either of said first or second groups of first code word parts, wherein the combination of a first code word part with the corresponding second code word part comprises a code word,
      store in the address table the respective starting location of the first group and the respective lengths of all of said first code word parts in the first group except for the last such code word part in said first group, and
      store in the address table the respective starting location of the second group and the respective lengths of the all the code word parts in the second group except for the last code word part in the second group.

35. The electronic system of claim 34 wherein the processor and the memory are disposed on a same semiconductor die.

36. A method, comprising:
   retrieving a first group of sequential executable code word parts from a first memory based on a starting location of the first group, on the lengths of all but a last one of the code word parts, and on a starting location of a second group of sequential executable code word parts in the first memory and contiguous with the last one of the code word parts in the first group;
   retrieving a third group of executable code word parts, each code word part in said third group having the same length; and decoding the code words by combining code word parts from the first group with code word parts from the third group.

37. The method of claim 36, further comprising retrieving from an address table the starting locations of the first and second groups and the lengths of all but the last one of the code word parts in said first and second groups.

38. The method of claim 36 wherein decoding the code words further comprises converting the code words corresponding to the code word parts in the first group into respective software-program instructions.

39. The method of claim 36 wherein decoding the code words further comprises:
calculating an address of a second memory from a base and an index comprising one of the code words; and
retrieving from the calculated address a decoded value corresponding to the one of the code words.

40. The method of claim 36 wherein decoding the code words further comprises:
calculating an address of the first memory from a base and an index composing one of the code words; and
retrieving from the calculated address a decoded value corresponding to the one of the code words.

41. The method of claim 36 wherein decoding the code words further comprises associating with one of the code words a decoded value associated with a previously decoded one of the code words.

42. The method of claim 36 wherein decoding the code words further comprises associating with one of the code words a decoded value that derived from a portion of the one of the code words.

43. The method of claim 36 wherein decoding the code words further comprises associating with one of the code words a decoded value that equals a portion of the one of the code words.

44. The method of claim 36, further comprising calculating a length of a last code word part in the first group equal to a difference between a starting location of the last code word part and the starting location of the first code word part in the second group.

45. An electronic system, comprising:
a memory; and
a processor coupled to the memory and operable to
retrieve a first group of sequential executable code word parts from the memory based on a starting location of the first group, on the lengths of all but a last one of the code word parts, and on a starting location of a second group of sequential executable code word parts stored in the memory and contiguous with the last one of the code word parts in the first group,
retrieve a third group of code word parts, each code word part in said third group having the same length, and
decoding the code words by combining code word parts from the first group with code word parts from the third group.

46. The electronic system of claim 45 wherein the processor and the memory are disposed on a same semiconductor die.

47. A method, comprising:
retrieving a first group of sequential executable code word parts from a memory based on a starting location of the first group, on the lengths of all but a last one of the code word parts each of said first code word parts having a respective length, the respective length of one of said first code word parts being different than the respective length of at least another one of said first code word parts and different form at least the last one of the code word parts in the first group;
retrieving a second group of executable code word parts, each code word part in said second group having the same length; and
decoding the code words by combining code word parts from the first group with code word parts from the second group.

48. An electronic system, comprising:
a memory; and
a processor coupled to the memory and operable to
retrieve a first group of sequential executable code word parts from a memory based on a starting location of the first group, on the lengths of all but a last one of the code word parts each of said first code word parts having a respective length, the respective length of one of said first code word parts being different than the respective length of at least another one of said first code word parts and different form at least the last one of the code word parts in the memory,
retrieve a second group of executable code word parts, each code word part in said second group having the same length, and
decode the code words by combining code word parts from the first group with code word parts from the second group.

49. A method, comprising:
storing a group of first executable code word parts in a first series of sequential locations of a memory based on a starting location of the first group, on the lengths of all but a last one of the code word parts each of said first code word parts having a respective length, the respective length of one of said first code word parts being different than the respective length of at least another one of said first code word parts and different form at least the last one of the code word parts in the first series;
storing in a second series of sequential locations of the memory a group of second executable code word parts, each of said second code word parts having a same length and corresponding to one of the code word parts in said group of first code word parts, wherein the combination of a first code word part with the corresponding second code word part comprises a code word.

50. An electronic system, comprising:
a memory; and
a processor coupled to the memory and operable to
store a group of first executable code word parts in a first series of sequential locations of the memory based on a starting location of the first group, on the lengths of all but a last one of the code word parts each of said first code word parts having a respective length, the respective length of one of said first code word parts being different than the respective length of at least another one of said first code word parts and different form at least the last one of the code word parts in the first series;
store in a second series of sequential locations of the memory a group of second executable code word parts, each of said second code word parts having a same length and corresponding to one of the code word parts in said group of first code word parts, wherein the combination of a first code word part with the corresponding second code word part comprises a code word.

* * * * *

UNITED STATES PATENT AND TRADEMARK OFFICE
CERTIFICATE OF CORRECTION

PATENT NO. : 7,594,098 B2  Page 1 of 1
APPLICATION NO. : 11/480781
DATED : September 22, 2009
INVENTOR(S) : Didier Fuin It is certified that error appears in the above-identified patent and that said Letters Patent is hereby corrected as shown below:

Claim 49, Column 22, Line 36 of the patent, please change the text "one of said first code word parts and different form at" to -- one of said first code word parts, and different from at --.

Signed and Sealed this

Ninth Day of November, 2010

David J. Kappos
*Director of the United States Patent and Trademark Office*